United States Patent [19]

Muro

[11] Patent Number: 4,920,395
[45] Date of Patent: Apr. 24, 1990

[54] HIGH SENSITIVITY PHOTODIODE

[75] Inventor: Hideo Muro, Yokohama, Japan

[73] Assignee: Nissan Motor Company, Limited, Yokohama, Japan

[21] Appl. No.: 235,803

[22] Filed: Aug. 23, 1988

Related U.S. Application Data

[63] Continuation of Ser. No. 925,219, Oct. 31, 1986, abandoned.

[30] Foreign Application Priority Data

Nov. 8, 1985 [JP] Japan .................. 60-248795

[51] Int. Cl.$^5$ .......................................... H01L 27/14
[52] U.S. Cl. ........................................ 357/30; 357/41; 357/48; 357/22
[58] Field of Search .............. 357/30 I, 30 G, 30 P, 357/41, 22 B, 22 F, 48

[56] References Cited

U.S. PATENT DOCUMENTS

| | | | |
|---|---|---|---|
| 3,309,610 | 3/1967 | Yamamoto | 357/22 |
| 3,529,217 | 9/1970 | Santen | 357/30 P |
| 4,237,473 | 12/1980 | Chiang | 357/22 B |
| 4,241,358 | 12/1980 | Wade | 357/30 G |
| 4,318,115 | 3/1982 | Yoshikawa | 357/30 D |
| 4,649,409 | 3/1987 | Roppongi et al. | 357/30 P |

FOREIGN PATENT DOCUMENTS 0146967  11/1980  Japan .................. 357/30 G Primary Examiner—Martin H. Edlow
Attorney, Agent, or Firm—Foley & Lardner, Schwartz, Jeffery, Schwaab, Mack, Blumenthal & Evans

[57] ABSTRACT

The sensitivity of a photodiode, which has a semiconductor substrate of first conductivity, an island region of an epitaxial layer of oppposite second conductivity formed on the substrate, a diffused region of the first conductivity formed in the epitaxial layer through its entire thickness so as to define the island region and a diffused region of the second conductivity formed in a surface region of a marginal area of the island region, is enhanced by forming a shallow laminar region of the first conductivity in the surface of a major area of the island region by ion implantation. The photodiode of improved sensitivity can be integrated with simplified circuit components to provide a single-chip photodetecting or photosensitive device by a conventional bipolar process.

2 Claims, 2 Drawing Sheets

HIGH SENSITIVITY PHOTODIODE

This application is a continuation of application Ser. No. 925,219, filed Oct. 31, 1986, now abandoned.

BACKGROUND OF THE INVENTION

This invention relates to a photodiode which improved sensitivity and is suitable for integration with related semiconductor devices or circuits in bipolar ICs.

In a conventional photodiode which is fabricated by a standard bipolar process, a silicon substrate of first-type (e.g. p-type) conductivity and an epitaxially grown layer of opposite conductivity (e.g. n⁻-type) provide a PN junction. In a selected region the epitaxial layer is converted to a p+-type diffused isolation region which is in such a pattern that an n⁻-type island region is defined on the silicon substrate. In the surface of a marginal area of the island region there is formed an n+-type emitter diffusion region, which is used as cathode while the p+-type diffused isolation region is used as anode. A field oxide film lies over the entire area of the device except where aluminum interconnections are formed. In operation of this diode the PN junction between the p-type silicon substrate and the n⁻-type epitaxial layer in the island form is reverse-biased. When the diode is illuminated a current will flow between the anode and the cathode.

In the conventional photodiode of such construction the thickness of the epitaxially grown layer is usually about 10 μm, and it is difficult to greatly reduce this thickness. That is, the PN junction of the photodiode is at a considerable depth from the surface on which light is incident. Therefore, electron and hole pairs created in regions close to the surface do not effectively contribute to the output current, so that the sensitivity of the photodiode is not sufficiently high.

In the case of integrating a photodiode with related circuit elements in a semiconductor chip to produce a photodetector, low sensitivity of the photodiode causes the circuit elements to be made complicated and to occupy a considerably large area of the semiconductor chip and, therefore, leads to high production cost. Furthermore, the resultant photodetector suffers from relatively high probability of wrong function because it is difficult to secure ample S/N ratio due to insufficient sensitivity of the photodiode. In industrial fabrication the amount of unacceptable products becomes considerable.

SUMMARY OF THE INVENTION

It is an object of the present invention to provide an improved photodiode which is sufficiently high in sensitivity to thereby solve the aforementioned problems in the prior art relating to integrated photodetectors.

A photodiode according to the invention has a semiconductor substrate of first-type conductivity, a semiconductor layer of opposite second-type conductivity formed on a principal surface of the substrate, a first diffused region of the first-type conductivity formed in the semiconductor layer through its entire thickness in such a pattern that an island region of the semiconductor layer is surrounded by the diffused region, and a second diffused region of the second-type conductivity formed for use as an electrode in a surface region of a selected area of the island region, and the PN junction between the substrate and the island region of the semiconductor layer is reverse-biased in operation of the photodiode. The photodiode is characterized in that a shallow laminar region of the first-type conductivity is formed in the surface of a major area of the island region.

The shallow laminar region of the first-type conductivity is formed by ion implantation so that the thickness of this laminar region is usually less than 1 μm. By forming such a shallow laminar region of the same conductivity as the semiconductor substrate, a second PN junction is produced at a very short distance from the surface on which light is incident. In operation the second PN junction too is reverse-biased. Then, electron and hole pairs created in the vicinity of the surface are also effectively utilized in the output current of the photodiode. Therefore, this photodiode is remarkably higher in sensitivity than the conventional photodiode which has a single PN junction at a considerable depth from the surface.

In producing a single-chip photodetecting or photosensitive semiconductor device including a photodiode according to the invention, it is possible to simplify the circuit for treating the output of the photodiode owing to the enhanced sensitivity of the photodiode. Therefore, in industrial production the amount of unacceptable products decreases and the production cost reduces. Furthermore, the produced devices exhibit improved performance as an ample S/N ratio can be secured. For example, a single-chip photodetector including a photodiode according to the invention and a JFET, which applies reverse bias to the photodiode in a constant microcurrent load mode and amplifies the output of the photodiode, can be fabricated at low cost by a standard bipolar process.

DESCRIPTION OF THE PREFERRED EMBODIMENTS

Figure 1:
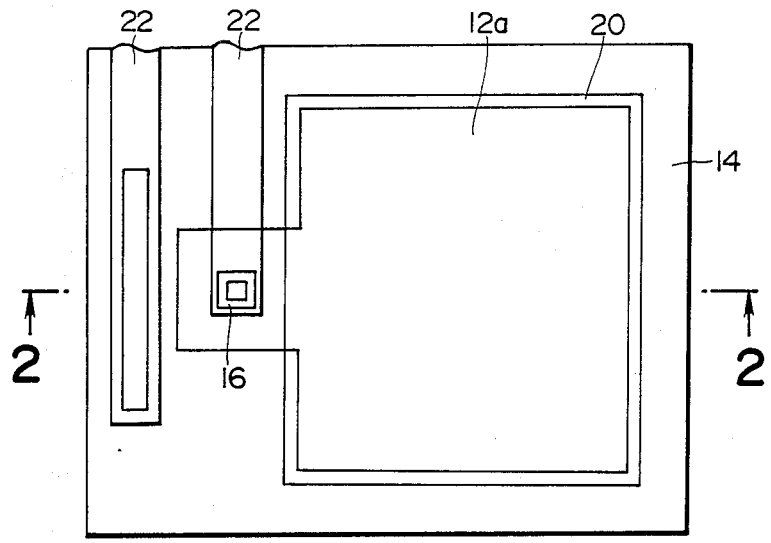
FIG. 1 is a plan view of a photodiode as an embodiment of the present invention.
Figure 2:
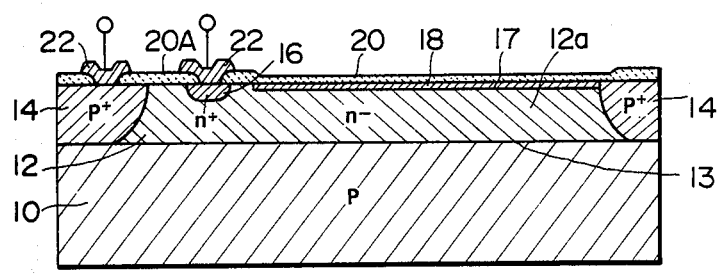
FIG. 2 is a sectional view taken along the line 2—2 in FIG. 1.

FIGS. 1 and 2 show a photodiode as an embodiment of the invention. In this device there is an n⁻-type epitaxial layer 12 grown on the principal surface of a p-type silicon substrate 10. For example, the thickness of the n⁻-type epitaxial layer 12 is about 10 μm. A selected region of the n⁻-type epitaxial layer 12 is converted to a p+-type diffused isolation region 14 such that an island region 12a of the n⁻-type layer 12 is surrounded by the p+-type isolation region 14. In the surface of a selected marginal area of the island region 12a there is formed a narrow and relatively shallow n+-type emitter diffusion region 16. In the surface of a major area of the island region 12a there is formed a shallow p-type laminar region 18, and the surface of this p-type layer 18 is covered with a thin oxide film 20. For example, the thickness of this oxide film 20 is about 1000 Å. In the remaining area the surface of the device is covered with a relatively thick field oxide film 20A, which is locally removed to form aluminum interconnections 22. In the thus constructed photodiode there is a PN junction 17 between the p-type thin layer 18 and the n⁻-type epitaxial layer 12a in the island form in addition to the PN junction 13 between the p-type substrate 10 and the n⁻-type epitaxial layer 12. In this device the n⁺-type emitter diffusion region 16 is used as cathode and the p⁺-type diffused isolation region 14 as anode.

The device of FIGS. 1 and 2 can be fabricated by using conventional standard bipolar techniques. The first step is epitaxially growing the n⁻-type layer 12. Then, p-type impurity diffusion to form the isolation region 14 and n-type impurity diffusion to form the emitter diffusion region 16 are carried out in turn, and the field oxide film 20A is formed over the entire area. After that the oxide film 20A is removed by etching in the selected major area of the n⁻-type island region 12a, and the shallow p-type laminar region 18 is formed in the etched area by ion implantation of boron. For example, the boron ion implantation is performed at about 100 KeV to the extent of a dose of about $1.2 \times 10^{12}$ cm². After that the thin oxide film 20 is formed by a wet oxidation method, and the aluminum interconnections 22 are formed via contact etching.

In operation of the photodiode of FIGS. 1 and 2 the two PN junctions 13 and 17 are both reverse-biased. When the area covered with the thin oxide film 20 is illuminated electron and hole pairs are created in the device. Representing the intensity of light by $\phi$ and light attenuation coefficient by $\alpha$, the density of either electron pairs or hole pairs at depth X from the surface of the device is proportional to $\phi\exp(-\alpha X)$. The electron pairs and hole pairs created within the diffusion distance from a PN junction contribute to the output current. In the device of FIGS. 1 and 2 which has the PN junction 17 at a very short distance from the surface in addition to the PN junction 13 at a depth of about 10 μm, the conversion efficiency is considerably improved.

Figure 3:
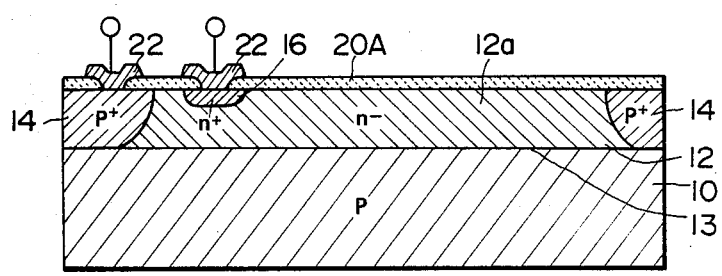
FIG. 3 is a sectional view of a conventional photodiode.

For comparison, FIG. 3 shows the construction of a conventional photodiode on which the above described improvement according to the invention is made. In the conventional diode no p-type layer is formed in the surface of the n⁻-type island region 12a, and the surface of the n⁻-type island region 12a is entirely covered with the relatively thick field oxide film 20A. In other words, in the photodetecting area of the conventional device there is a single pN junction 13 at a depth of about 10 μm from the surface on which light is incident.

For a comparative experiment, the device of FIGS. 1 and 2 and the conventional device of FIG. 3 were produced in an identical manner except the formation of the p-type thin layer 18 and the thin oxide film 20 in the former device. In the both devices the n⁻-type epitaxial layer 12 was 10 μm in thickness and 1 Ω·cm in resistivity. When exposed to infrared rays of 840 nm wavelength the output current of the conventional device was 0.2 μA per μW, whereas the output current of the device according to the invention was 0.34 μA per μW. That is, the device according to the invention was about 1.7 times higher in sensitivity.

For maximum enhancement of sensitivity, it is effective to enlarge the area of the shallow p-type region 18 so as to occupy almost the entire area of the surface of the n⁻-type island region 12a except the area of the n⁺-type emitter diffusion region 16.

Figure 4:
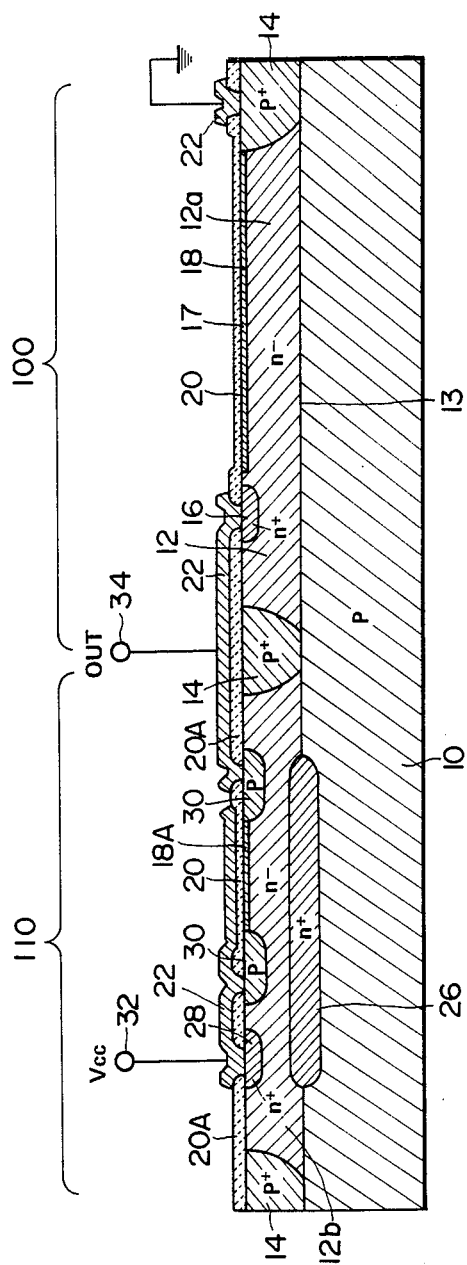
FIG. 4 is a sectional view of a single-chip photodetection device in which the photodiode of FIGS. 1 and 2 and a JFET are integrated.

FIG. 4 shows a single-chip semiconductor device which serves as a photodetector and in which a photodiode 100 similar to the one shown in FIGS. 1 and 2 is integrated with a junction-gate field-effect transistor (JFET) 110, which applies reverse bias to the photodiode 100 and amplifies the output of the photodiode.

In the device of FIG. 4 the p-type silicon substrate 10 and the n⁻-type epitaxial layer 12 are common to the photodiode part 100 and the JFET part 110. In the JFET part 110 an island region 12b of the n⁻-type layer 12 is defined by p⁺-type diffused isolation regions 14. In the island region 12b there is an n⁺-type buried layer 26, and a narrow n⁺-type emitter diffusion region 28 and p-type base diffusion stripe regions 30 are formed in the surface. In the surface of the area between the p-type stripes 30 a shallow p-type laminar region 18A is formed similarly to the shallow p-type laminar region 18 in the photodiode 100 by ion implantation of boron. In this area the surface is covered with a thin oxide film 20. In this JFET 110 the n⁻-type epitaxial layer 12 becomes the gate, and the two p-type stripes 30 are used as the source and the drain. The shallow p-type region 18A provides a channel. Indicated at 32 is a power terminal, and at 34 an output terminal. The single-chip device of FIG. 4 can be fabricated by a conventional bipolar process.

In the photodetection device of FIG. 4, the JFET part 110 is used to reverse-bias the photodiode 100 with a constant microcurrent load, and the same part 110 serves the function of amplifying and transforming the output current of the photodiode 100 such that a "0" signal or a "1" signal appears at the output terminal 34 depending whether the light-induced output is below or above a predetermined threshold level.

What is claimed is:

1. A single-chip semiconductor photodetection device comprising:
    a semiconductor substrate of first-type conductivity;
    a semiconductor layer of opposite second-type conductivity formed on a principal surface of said substrate;
    a photodiode part which comprises a first island region of said semiconductor layer surrounded by a first diffused region of the first-type conductivity formed through the entire thickness of said semiconductor layer, a second diffused region of the second-type conductivity formed for use as an electrode in a surface region of a selected area of said first island region and a shallow laminar region of the first-type conductivity formed in the surface of a major area of said first island region, wherein first and second active junctions are respectively formed at an interface of said first island region and said semiconductor substrate and an interface of said shallow laminar region and said first island region; and
    a junction-gate field-effect transistor (JFET) part which comprises as a gate region a second island region of said semiconductor layer surrounded by the first diffused region, a diffused source region of the first-type conductivity formed in a surface region of said second island region, a diffused drain region of the first-type conductivity formed in a surface region of said second island region as a channel region a shallow laminar region of the first-type conductivity formed in the surface of said second island region in a location between said source region and said drain region and electrode means for interconnecting said source region with said gate region, the JFET part being electrically connected with said photodiode part such that in operation the JFET part provides a constant current to the photodiode part and compares the output current of the photodiode part with a predetermined current.

2. A device according to claim 1, wherein said shallow laminar region is formed by ion implantation.

* * * * *